US012583737B2

(12) United States Patent
Ali

(10) Patent No.: US 12,583,737 B2
(45) Date of Patent: Mar. 24, 2026

(54) MEMS OPTICAL MICROPHONE

(71) Applicant: AAC ACOUSTIC TECHNOLOGIES (SHENZHEN) CO., LTD., Shenzhen (CN)

(72) Inventor: Taimoor Ali, London (GB)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 591 days.

(21) Appl. No.: 17/952,359

(22) Filed: Sep. 26, 2022

(65) Prior Publication Data

US 2024/0101411 A1     Mar. 28, 2024

(51) Int. Cl.
*H04R 23/00* (2006.01)
*B81B 3/00* (2006.01)

(52) U.S. Cl.
CPC ......... *B81B 3/0021* (2013.01); *H04R 23/008* (2013.01); *B81B 2201/0257* (2013.01); *B81B 2201/047* (2013.01); *B81B 2203/0127* (2013.01); *B81B 2203/0307* (2013.01); *B81B 2203/0315* (2013.01); *B81B 2203/0353* (2013.01); *B81B 2203/053* (2013.01); *H04R 2201/003* (2013.01)

(58) Field of Classification Search
CPC .......... B81B 3/0021; B81B 2201/0257; B81B 2201/047; B81B 2203/0127; B81B 2203/0307; B81B 2203/0315; B81B 2203/0353; B81B 2203/053; H04R 23/008; H04R 2201/003; H04R 1/04
See application file for complete search history.

(56) References Cited

U.S. PATENT DOCUMENTS

| | | | |
|---|---|---|---|
| 7,355,720 B1 * | 4/2008 | Carr ..................... | H04R 23/008 356/498 |
| 9,936,306 B1 * | 4/2018 | Zhang ................... | B81B 7/0061 |
| 2014/0084396 A1 * | 3/2014 | Jenkins ............... | H04R 23/006 257/419 |
| 2015/0365770 A1 * | 12/2015 | Lautenschlager .... | H04R 19/005 381/172 |
| 2019/0084827 A1 * | 3/2019 | Dehe ...................... | H04R 19/04 |
| 2019/0210866 A1 * | 7/2019 | Chen ..................... | B81B 3/0072 |
| 2020/0100034 A1 * | 3/2020 | Zhang ..................... | H04R 1/04 |
| 2020/0213770 A1 * | 7/2020 | Duan ...................... | H04R 17/02 |

* cited by examiner

*Primary Examiner* — William B Partridge
*Assistant Examiner* — Erik A. Anderson
(74) *Attorney, Agent, or Firm* — Wiersch Law Group

(57)     ABSTRACT

An MEMS optical microphone, including: a shell including an inner cavity and a sound inlet that communicates the inner cavity with outside; a MEMS module including a diaphragm suspended in the inner cavity, a light flap is formed in the diaphragm, when an acoustic pressure is applied, an aperture is formed by opening of the light flap, and a size of the aperture increases or decreases with a magnitude of the acoustic pressure applied; an optoelectronic module including an electromagnetic radiation source and a sensor arranged on opposite sides of the diaphragm, and a light beam passes through the aperture to the sensor; and an integrated circuit module electrically connected with the optoelectronic module. Advantages of high sensitivity and flat frequency response are realized.

8 Claims, 6 Drawing Sheets

MEMS OPTICAL MICROPHONE

TECHNICAL FIELD

The present disclosure relates to the technical field of microphones and, in particular, to a MEMS optical microphone.

BACKGROUND

Conventional microphones are based on capacitors, where a diaphragm vibrates with sound waves and generates a voltage change upon changing a distance between plates of the capacitors, thereby achieving acoustic-electrical conversion.

Optical microphone is a new type of microphone. An optical microphone generally includes: an optoelectronic module, an application specific integrated circuit (ASIC), and a micro-electro-mechanical system (MEMS). The optoelectronic module can emit light to the MEMS, and receive light reflected by the MEMS. When sound wave actuates the diaphragm of the MEMS, the diaphragm vibrates slightly and thus changes intensity and phase of the light reflected back to the optoelectronic module. The optoelectronic module converts the intensity and phase signal of the reflected light into an electrical signal, and transmits to the ASIC, so as to realize transformation from acoustic signal to optical signal and then to electrical signal.

With the increasingly high experience requirements of consumers, it is necessary to propose an MEMS optical microphone with better performance.

SUMMARY

The purpose of the present disclosure is to provide an MEMS optical microphone to solve the technical problems in the related art.

The present disclosure provides an MEMS optical microphone, including: a shell including an inner cavity and a sound inlet that communicates the inner cavity with outside; an MEMS module including a diaphragm suspended in the inner cavity, a light flap is formed in the diaphragm; when sound pressure is applied an aperture is formed by the opening of the light flap, and a size of the aperture increases or decreases with magnitude of the sound pressure; an optoelectronic module including an electromagnetic radiation source and a sensor, the electromagnetic radiation source and the sensor are arranged on opposite sides of the diaphragm, and a light beam emitted by the electromagnetic radiation source passes through the aperture and reaches the sensor; and an integrated circuit module electrically connected with the optoelectronic module.

As an improvement, the light flap forms a narrow slit and when acoustic pressure is applied an aperture is formed by a widening of this slit.

As an improvement, a plurality of light flaps are arranged on the diaphragm; when an acoustic pressure is applied, the aperture is formed by the opening of slits between light flaps.

As an improvement, an anchor structure is formed to increase the compliance of the hinge and reduce the pressure required to open the aperture.

As an improvement, the anchor hinge is disposed in the middle of the first end of the light flap.

As an improvement, a plurality of anchor hinges are provided, and the plurality of anchor hinges are arranged in parallel and spaced apart from one another.

As an improvement, the electromagnetic radiation source includes a laser or a light emitting diode, and the sensor includes a photodiode.

As an improvement, the inner cavity includes a first shell wall, a second shell wall, and a side shell wall connecting the first shell wall and the second shell wall, the first shell wall is opposite to the second shell wall, the MEMS module and the integrated circuit module are arranged on the first shell wall, and the sound inlet is arranged on the first shell wall or the second shell wall.

As an improvement, a plurality of sound inlets are provided, and the plurality of sound inlets are distributed on the first shell wall or the second shell wall.

As an improvement, the sound inlet is provided on the first shell wall, the MEMS module further includes a support arm, and opposite ends of the support arm are respectively connected to the diaphragm and the first shell wall, so as to suspend the diaphragm in the inner cavity; the diaphragm divides the inner cavity along an incident direction of sound wave into a front cavity and a rear cavity, and the front cavity covers the sound inlet.

Compared with the related art, the present disclosure is provided with a light flap or light flaps in the diaphragm, when an acoustic pressure is applied an aperture is formed in the hinge region, and the aperture is opened or closed in response to the pressure or sound signal applied to the diaphragm, this controls the amount of light transmitted through the aperture, the transmitted beam is converted into an electrical signal, the electrical signal corresponds to the applied pressure level of the sound signal, and thus achieving the advantages of high sensitivity and flat frequency response, thereby further improving performance of the device.

REFERENCE SIGNS

10—shell, 11—sound inlet, 12—first shell wall, 13—second shell wall, 14—side shell wall, 15—inner cavity, 16—front cavity, 17—rear cavity;

20—MEMS module, 21—diaphragm, 22—hinge region, 23—light flap, 24—aperture, 25—support arm, 26—anchor hinge;

30—optoelectronic module, 31—electromagnetic radiation source, 32—sensor, 33—light beam;

40—integrated circuit module.

DESCRIPTION OF EMBODIMENTS

Embodiments described below with reference to the accompanying drawings are exemplary and are only configured to explain the present disclosure, but not to be construed as limitations to the present disclosure.

Figure 1:
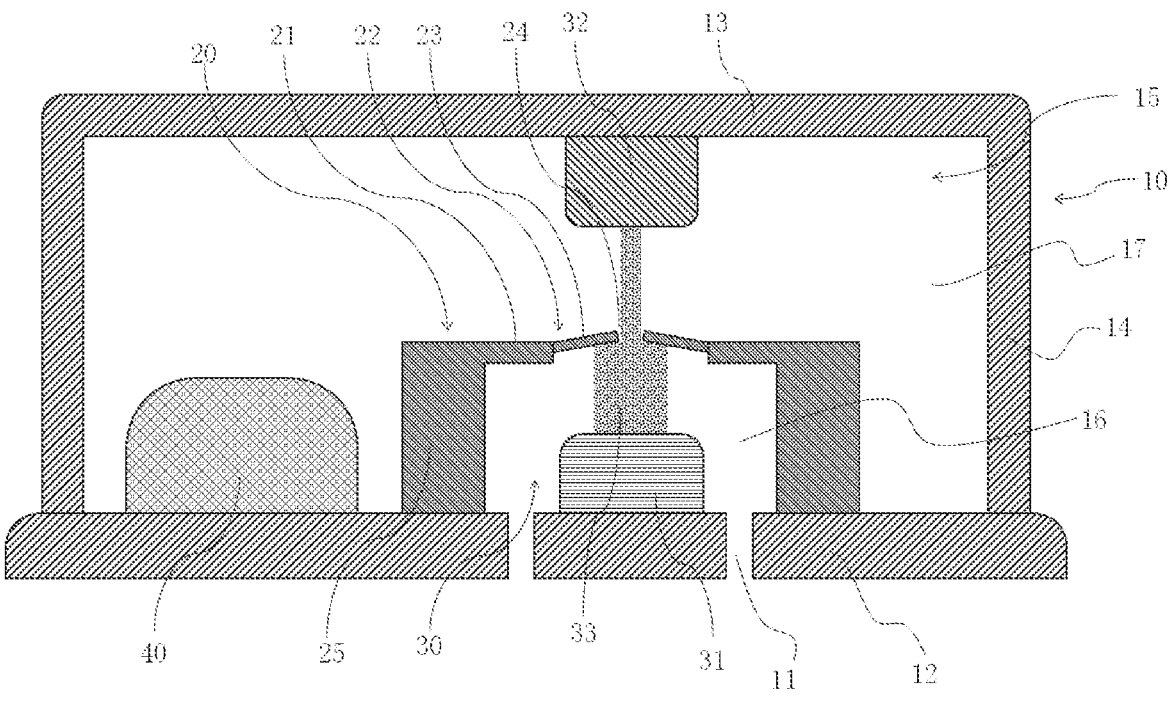
FIG. 1 is a schematic structural diagram of a MEMS optical microphone according to an embodiment of the present disclosure.
Figure 2:
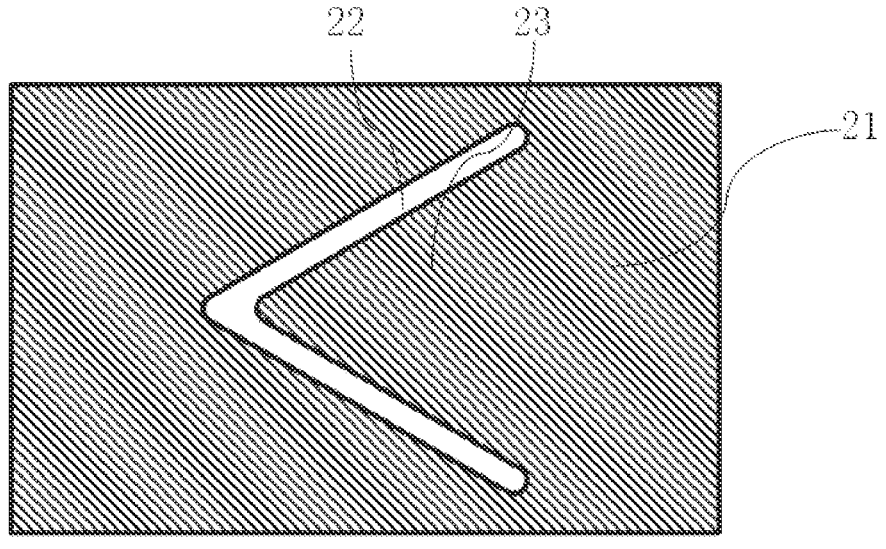
FIG. 2 is a top view of a light flap of a first structure in a first state according to an embodiment of the present disclosure.

As shown in FIG. 1, an embodiment of the present disclosure provides an MEMS optical microphone, including: a shell 10, a MEMS module 20, an optoelectronic module 30 and an integrated circuit module 40.

The shell 10 has an inner cavity 15 and a sound inlet 11 that communicates the inner cavity 15 with the outside. The inner cavity 15 includes a first shell wall 12, a second shell wall 13, and a side shell wall 14 connecting the first shell wall 12 and the second shell wall 13. The first shell wall 12 and the second shell wall 13 are opposite to each other, the MEMS module 20 and the integrated circuit module 40 are arranged on the first shell wall 12, and the sound inlet 11 is provided on the first shell wall 12 or the second shell wall 13. It should be noted that the side shell wall 14 can be integrally formed as a part of the first shell wall 12 or the second shell wall 13, or can be an independent part.

The MEMS module 20 includes a diaphragm 21, the diaphragm 21 is suspended in the inner cavity 15, a light flap 23 is formed in the diaphragm 21, the first end of the light flap 23 is connected to the diaphragm in a hinge region 22 and the second end of the light flap 23 is suspended. When an acoustic pressure is applied, an aperture 24 is formed through the movement of the light flaps, and the size of the aperture 24 increases or decreases with sound pressure. When the optical microphone is in use, sound waves enter into the shell 10 through the sound inlet 11 and actuate the diaphragm 21. When an acoustic pressure is applied to the light flap 23 vibrates, the light flap 23 moves upwards (or downwards depending on the type of the microphone) and the light flap 23 moves downwards in the opposite direction (or upwards depending on the type of the microphone) just like a standard oscillating structure with specific frequency and displacement. Where the frequency depends on the frequency of the sound wave, and the displacement depends on the pressure of the sound wave.

In a balanced state when no pressure or sound signal is applied, no sound waves enter into the sound inlet 11, the light flap 23 remains in a natural state. and the light cannot pass through the aperture 24. When the sound wave enters into the sound inlet 11 and actuates the light flap 23 of the MEMS module 20, the light flap 23 vibrates slightly and causes the hinge region 22 to fold. Thereby, the aperture 24 is formed. The size of the aperture 24 changes with the magnitude of the acoustic pressure applied, and the amount of light passing through the aperture 24 changes accordingly. When the size of the aperture 24 is larger, the amount of light transmitted is larger, and when the size of the aperture 24 is smaller, the amount of light transmitted is smaller.

The optoelectronic module 30 includes an electromagnetic radiation source 31 including, for example, an infrared (IR), visible light or ultraviolet (UV) source, which may be a laser or a light emitting diode; and a sensor 32 including a photodiode. The electromagnetic radiation source 31 and the sensor 32 are arranged on opposite sides of the diaphragm 21. In one embodiment, the electromagnetic radiation source 31 is arranged on the first shell wall 12, the sensor 32 is arranged on the second shell wall 13, and the electromagnetic radiation source 31 and the sensor 32 are arranged directly facing the aperture 24. The sensor 32 is configured to receive the light beam 33 emitted by the electromagnetic radiation source 31, and the light beam 33 covers the aperture 24. With the vibration of the light flap 23, the size of the aperture 24 changes accordingly, and the light amount of the passing beam 33 also changes synchronously. The light intensity increases with the increase of the sound pressure, and increases with the size of the aperture 24. When the light beam 33 is received by the sensor 32, the change of the light intensity generates a photocurrent corresponding to the level of the applied sound signal, and the light signal represented by the photocurrent is transmitted to the integrated circuit module 40, to realize the conversion from the acoustic signal to the optical signal and then to the electrical signal.

The integrated circuit module 40 is electrically connected to the optoelectronic module 30 and may also be connected to the MEMS module 20. The integrated circuit module (ASIC) 40 includes an electronic circuit that constitutes a control or central processing unit, which drives, controls and perform necessary action to the related electronic and optoelectronic components in the system.

In the present disclosure, a light flap 23 is provided in the diaphragm 21. When the light flap 23 moves, an aperture 24 is formed in the diaphragm 21, and the aperture 24 is open or closed in response to the pressure or sound signal applied to the diaphragm 21 and light flap 23. As a result, the amount of light transmitted through the aperture 24 is controlled, the transmitted light beam 33 is converted into an electrical signal, the electrical signal corresponds to the applied pressure level of the sound signal, and thus achieving the advantages of high sensitivity and flat frequency response, thereby further improving performance of the device.

Figure 3:
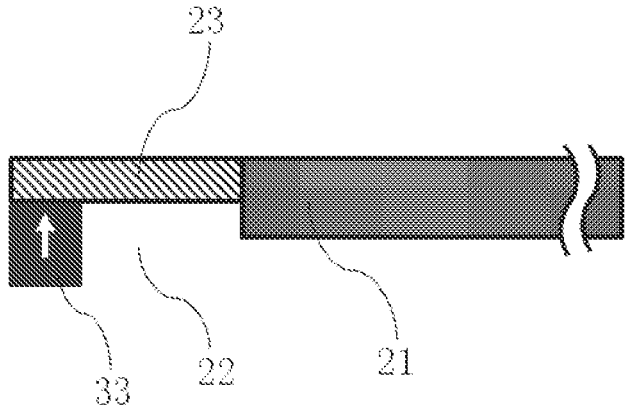
FIG. 3 is a cross-sectional view of a light flap of a first structure in a first state according to an embodiment of the present disclosure.
Figure 4:
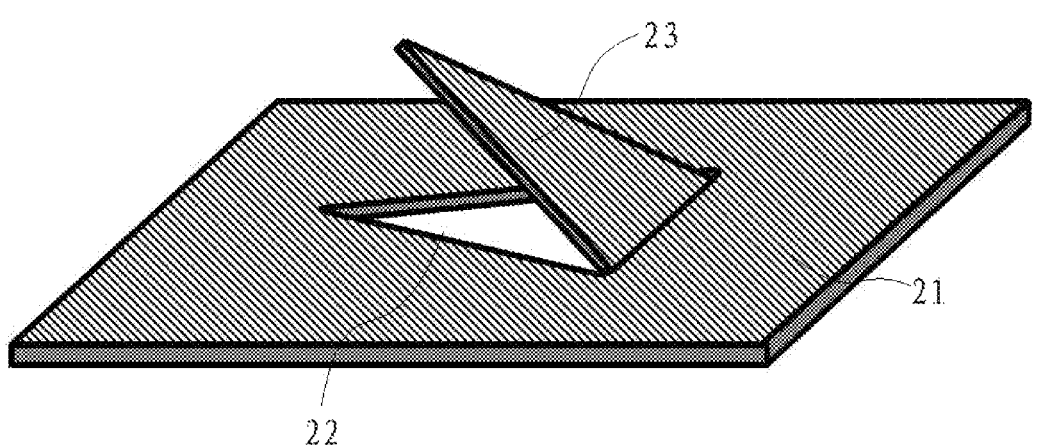
FIG. 4 is a perspective view of a light flap of a first structure in a second state according to an embodiment of the present disclosure.
Figure 5:
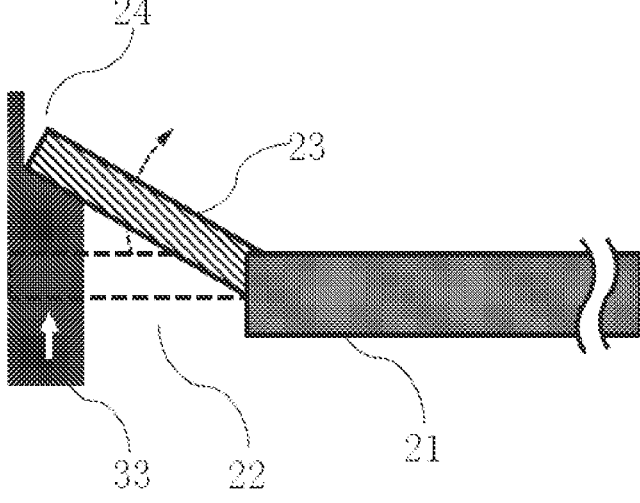
FIG. 5 is a cross-sectional view of a light flap of a first structure in a second state according to an embodiment of the present disclosure.
Figure 6:
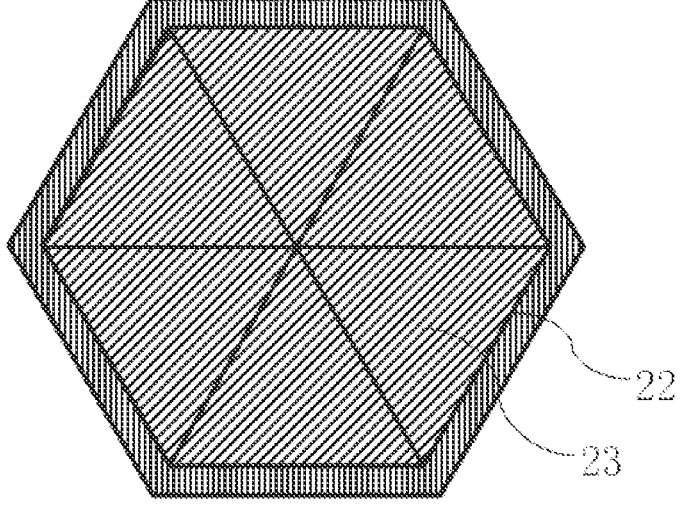
FIG. 6 is a top view of a light flap of a second structure in a first state according to an embodiment of the present disclosure.

Referring to FIGS. 2-5, FIG. 2 is a top view of a light flap of a first structure in a first state according to an embodiment of the present disclosure; FIG. 3 is a cross-sectional view of a light flap of a first structure in a first state according to an embodiment of the present disclosure; FIG. 4 is a perspective view of a light flap of a first structure in a second state according to an embodiment of the present disclosure; and FIG. 5 is a cross-sectional view of a light flap of a first structure in a second state according to an embodiment of the present disclosure. In the light flap 23 of the first structure, there is only a single light flap 23 in the diaphragm 21, and the outer contour of the light flap 23 is formed of a narrow slit. When the light flap 23 moves, an aperture 24 is formed between the outer edge of the light flap 23 and the inner wall of the diaphragm 21. is the light flap 23 fills a triangular portion of the diaphragm. Those skilled in the art can understand that the light flap 23 can also be set to other shapes, which is not limited herein.

In the balanced state when no pressure or sound signal is applied, the light flap 23 is in the first state, the light flap 23 be in line with the diaphragm 21, and the beam 33 emitted by the electromagnetic radiation source 31 cannot pass through. When the sound wave enters into the sound inlet 11, the light flap 23 are folded. Then the light flap 23 is in the second state, and an aperture 24 is formed between the light flap 23 and the hinge region 22, and the beam 33 emitted by the electromagnetic radiation source 31 passes through the aperture 24 and then reaches the sensor 32. The greater the magnitude of the acoustic pressure is applied to the diaphragm 21, the greater the angle of the light flap 23 is folded, and the larger the amount of the beam 33 will pass through. The sensor 32 receives this beam 33, and the change in light intensity generates a photocurrent corresponding to the level of the applied sound signal.

Figure 7:
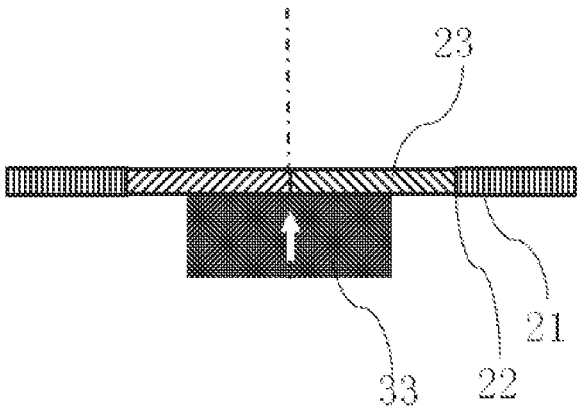
FIG. 7 is a cross-sectional view of a light flap of a second structure in a first state according to an embodiment of the present disclosure.
Figure 8:
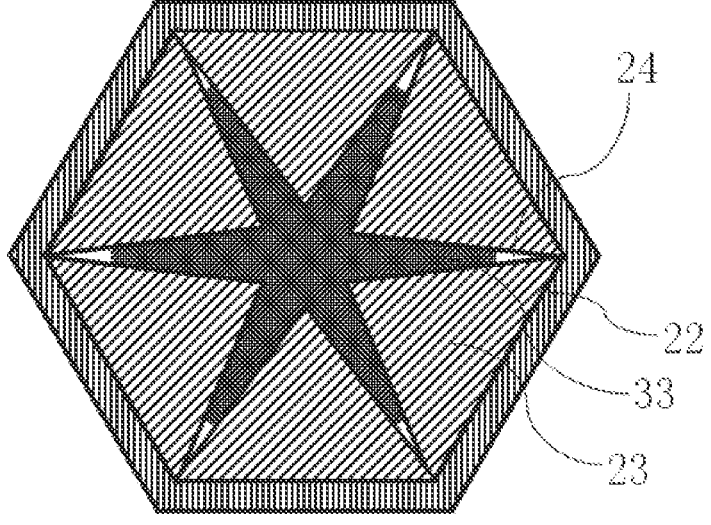
FIG. 8 is a top view of a light flap of a second structure in a second state according to an embodiment of the present disclosure.
Figure 9:
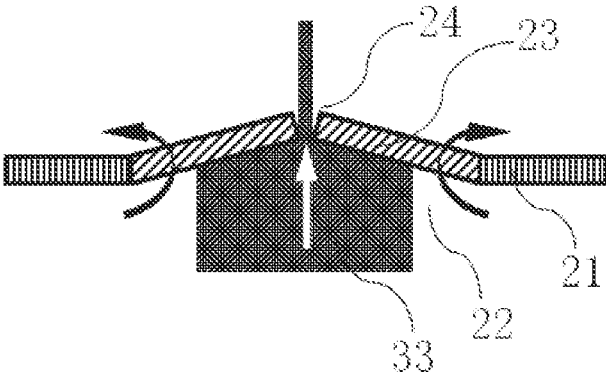
FIG. 9 is a cross-sectional view of a light flap of a second structure in a second state according to an embodiment of the present disclosure.
Figure 10:
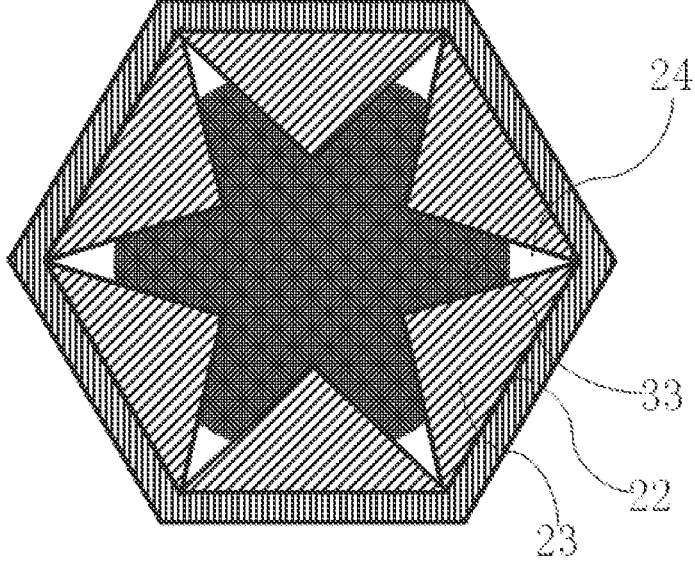
FIG. 10 is a top view of a light flap of a second structure in a third state according to an embodiment of the present disclosure.
Figure 11:
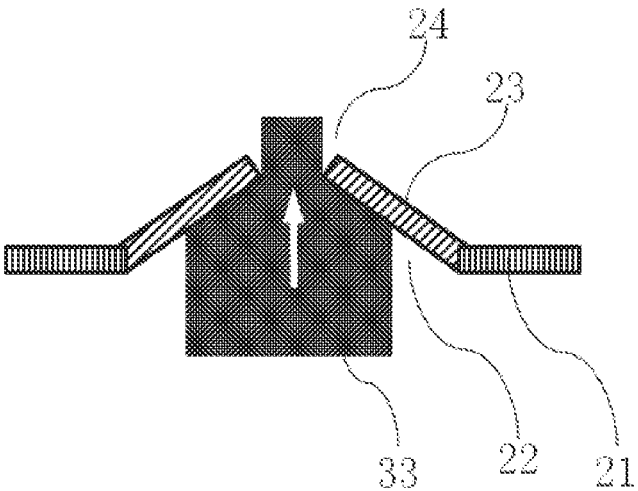
FIG. 11 is a cross-sectional view of a light flap of a second structure in a third state according to an embodiment of the present disclosure.

Referring to FIGS. 6-11, FIG. 6 is a top view of a light flap of a second structure in a first state according to an embodiment of the present disclosure; FIG. 7 is a cross-sectional view of a light flap of a second structure in a first state according to an embodiment of the present disclosure; FIG. 8 is a top view of a light flap of a second structure in a second state according to an embodiment of the present disclosure; FIG. 9 is a cross-sectional view of a light flap of a second structure in a second state according to an embodiment of the present disclosure; FIG. 10 is a top view of a light flap of a second structure in a third state according to an embodiment of the present disclosure; and FIG. 11 is a cross-sectional view of a light flap of a second structure in a third state according to an embodiment of the present disclosure. In the second structure, a plurality of light flaps 23 are arranged in the hinge region 22, and the structure formed by the plurality of light flaps 23 is adapted to the shape of the hinge region 22. When an acoustic pressure is applied, the aperture 24 is formed between the outer edges of the plurality of light flaps 23. The hinge region 22 is a hexagonal region, and each side of the hexagonal region is connected with a light flap 23. The light flaps 23 enclose to form a hexagonal structure, and the contour of the hexagonal structure matches the inner contour of the hexagonal region.

In the balanced state when no pressure or sound signal is applied, the light flap 23 is in the first state, the plurality of light flaps 23 will block the hinge region 22, and the light beam 33 emitted by the electromagnetic radiation source 31 cannot pass through. When the sound wave enters into and actuate the light flap 23 of the MEMS module 20, the light flaps 23 are folded, and an aperture 24 is formed between the outer edges of the adjacent light flaps 23. At this time, the light flap 23 is in the second state, the beam 33 emitted by the electromagnetic radiation source 31 passes through the aperture 24 and then reaches the sensor 32. The greater the magnitude of the acoustic pressure is applied to the diaphragm 21, the larger the angle of the light flap 23 is folded, and the greater amount of the beam 33 will pass through. When the light flaps 23 are folded to the maximum position, the light flap 23 is in the third state and reaches the limit position detected by the optoelectronic module 30, which corresponds to the maximum sound level that the microphone can detect.

Figure 12:
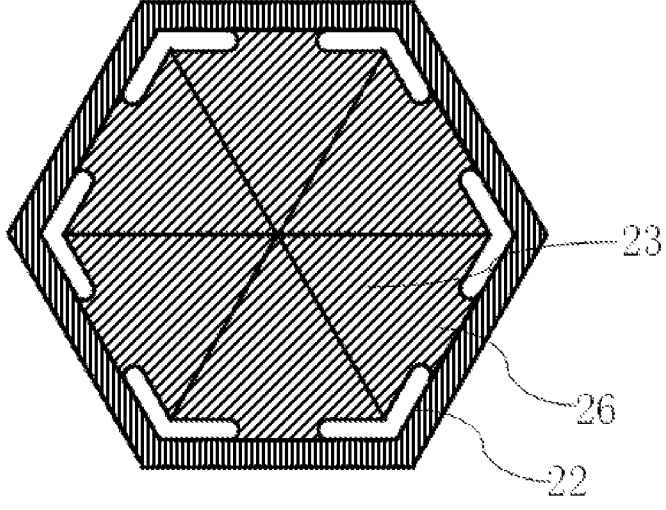
FIG. 12 is a top view of a light flap of a third structure according to an embodiment of the present disclosure.

Referring to FIG. 12, FIG. 12 is a top view of a diaphragm of a third structure according to an embodiment of the present disclosure. In the diaphragm 21 of the third structure, the hinge region 22 is also a hexagonal region, and each side of the hexagonal region is connected with a light flap 23, the light flap 23 is a triangular structure. Six light flaps

23 enclose to form a hexagonal structure, and a first end of the light flap 23 is connected with an anchor hinge 26. One end of the anchor hinge 26 away from the light flap 23 is connected with the inner wall surface of the hinge region 22. In one embodiment, a single anchor hinge 26 is provided, and the single anchor hinge 26 is arranged in the middle of the first end of the light flap 23, so that the compliance of the light flap 23 can be improved. When the acoustic pressure is small, the light flap 23 can still be deformed to a certain extent, so that the aperture 24 is generated in the hinge region 22, and the aperture 24 can correspond to a smaller deformation degree of the diaphragm 21, so that the amount of the light beam 33 changes.

Figure 13:
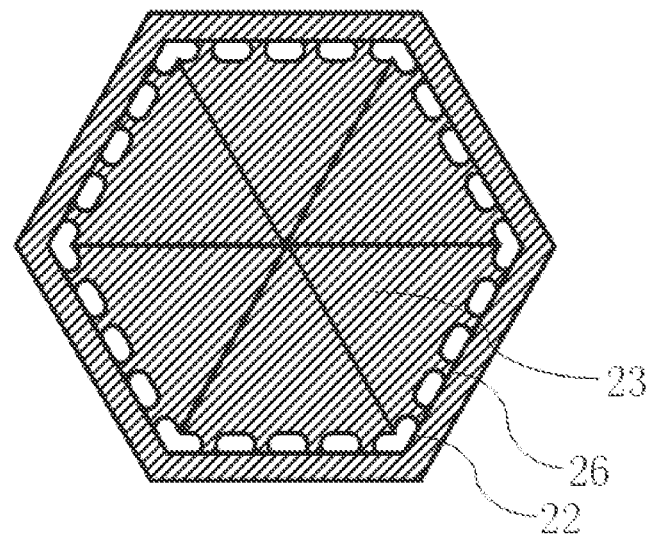
FIG. 13 is a top view of a light flap of a fourth structure according to an embodiment of the present disclosure.

Referring to FIG. 13, FIG. 13 is a top view of a light flap of a fourth structure according to an embodiment of the present disclosure. In the light flap 23 of the fourth structure, different from the light flap 23 of the third structure, there are a plurality of anchor hinges 26, and the plurality of anchor hinges 26 are arranged in parallel and spaced apart from one another, so that the compliance can be improved while sufficient support is provided to hold the light flaps 23 in its balanced position. It is important to maintain the balanced horizontal position of the light flap 23 because it defines the size of the initial aperture 24 when no sound is applied. The light intensity at this position can be used as a reference for the situation when a sound signal is applied. Furthermore, in other embodiments, the light flap 23 may have other structural, shape or material modifications to improve compliance, as long as the diaphragm 21 has a variable aperture size when an acoustic signal is applied thereon.

In embodiments of the present disclosure, the size of the light beam 33 is larger than the maximum size of the aperture 24. When the aperture 24 expands to the limit position, the size of the aperture 24 is the largest. At this time, the aperture 24 is still within the coverage of the beam 33. If the size of the beam 33 is smaller than the maximum size of the aperture 24, when the aperture 24 is opened to the maximum size, the amount of the transmitted light beam 33 has already reached the maximum value. In this case, when the size of the aperture 24 is further opened due to the change of the sound signal, such as when the size of the aperture 24 reaches the maximum size, the amount of light passing through the aperture 24 will remain unchanged. As a result, a constant photocurrent is recorded in the sensor 32 for an acoustic signal of this level. This means that even though the aperture 24 can change its size, the sensor 32 will limit the detection of certain levels of sound signals. This will limit the dynamic range of the sensor 32. By setting the size of the light beam 33 emitted by the electromagnetic radiation source 31 to be larger than the maximum size of the aperture 24, the dynamic range of the MEMS optical microphone is improved, and a wider range of sound signals can be sensed, thus achieving higher sensitivity to linear change of the radiation or light intensity caused by the sound signal.

In one embodiment, a plurality of sound inlets 11 are provided, and the plurality of sound inlets 11 are distributed on the first shell wall 12 or the second shell wall 13 in a circular array. These sound inlets 11 can apply uniform pressure to the diaphragm 21, improve the stability of the diaphragm 21, and thus increase the linear range of the optoelectronic module 30.

Referring to FIG. 1, the sound inlet 11 is provided on the first shell wall 12, and the MEMS module 20 further includes a support arm 25. The opposite ends of the support arm 25 are respectively connected to the diaphragm 21 and the first shell wall 12, so as to suspend the diaphragm 21 in the inner cavity 15. The diaphragm 21 separates the inner cavity 15 along the incident direction of the sound wave to form a front cavity 16 and a rear cavity 17. The front cavity 16 covers the sound inlet 11, and the first shell wall 12 includes a PCB substrate. The front cavity 16 refers to the volume between the diaphragm 21 and the sound inlet 11, and the front cavity 16 is a cavity that does not contain any components, so as to improve its performance. The rear cavity 17 refers to the volume between the diaphragm 21 and the inner volume of the shell 10. The diaphragm 21 of the MEMS module 20 is arranged close to the sound inlet 11, so that the volume of the front cavity 16 is small, and the volume of the rear cavity 17 is large, which is beneficial to further improving the performance.

In embodiments according to the present disclosure, the shape of the diaphragm 21 is symmetrical about the center. The shape of the diaphragm 21 is not limited to a circle, but may also be such as a square which is symmetrical about the center. The diaphragm 21 can be made of a single material, and can also be made of multiple materials such as monocrystalline silicon, silicon nitride, silicon oxide, polycrystalline silicon, polyimide, metal, or any combination thereof.

The aperture 24 is located at the geometric center of the diaphragm 21, and the amplitude is the largest at the center of the diaphragm 21. Small acoustic pressure can also cause the size of the aperture 24 to change, thereby affecting the amount of light passing through the beam 33, and thus improving sensing accuracy of the sensor 32.

The structure, features and effects of the present disclosure have been described in detail above according to the embodiments shown in the drawings. The above are only the preferred embodiments of the present disclosure, but the scope of the present disclosure is not limited by the drawings. Changes made to the concept of the present disclosure, or modifications to equivalent embodiments with equivalent changes, shall fall within the protection scope of the present disclosure as long as they do not exceed the spirit covered by the description and drawings.

What is claimed is:

1. A micro-electro-mechanical system (MEMS) optical microphone, comprising:

a shell including an inner cavity and a plurality of sound inlets that acoustically connects the inner cavity with outside, wherein the inner cavity includes a first shell wall, a second shell wall, and a side shell wall connecting the first shell wall and the second shell wall, the first shell wall is opposite to the second shell wall, the plurality of sound inlets is distributed on the first shell wall in a circular array;

a MEMS module including a diaphragm suspended in the inner cavity and a support arm with opposite ends respectively connected to the diaphragm and the first shell wall for suspending the diaphragm in the inner cavity, the MEMS module dividing the inner cavity into a front cavity and a rear cavity, and the front cavity covering the plurality of sound inlets, the diaphragm having a geometric center and being in a shape symmetrical about the geometric center, wherein a light flap is formed in the diaphragm, when an acoustic pressure is applied, an aperture is formed by movement of the light flap, and a size of the aperture increases or decreases with a magnitude of the acoustic pressure applied, the aperture is located at the geometric center of the diaphragm;

an optoelectronic module including an electromagnetic radiation source and a sensor, wherein the electromagnetic radiation source and the sensor are arranged on opposite sides of the diaphragm, the electromagnetic radiation source is arranged on the first shell wall and surrounded by the plurality of sound inlets, the sensor is arranged on the second shell wall, and a light beam emitted by the electromagnetic radiation source passes through the aperture and reaches the sensor; the size of the aperture changes in response to the acoustic pressure applied for changing a light amount of the light beam passing through the aperture to generate an electrical signal; and an integrated circuit module electrically connected with the optoelectronic module.

2. The MEMS optical microphone according to claim 1, wherein the light flap forms a narrow slit, and when an acoustic pressure is applied, the aperture is formed by widening of the narrow slit.

3. The MEMS optical microphone according to claim 1, wherein a plurality of light flaps is formed in the diaphragm, when an acoustic pressure is applied, the aperture is formed by opening of narrow slits between the light flaps.

4. The MEMS optical microphone according to claim 1, wherein an anchor hinge is connected to a first end of the light flap.

5. The MEMS optical microphone according to claim 4, wherein the anchor hinge is disposed in a middle of the first end of the light flap.

6. The MEMS optical microphone according to claim 4, wherein a plurality of anchor hinges is provided, and the plurality of anchor hinges is arranged in parallel and spaced apart from one another.

7. The MEMS optical microphone according to claim 1, wherein the electromagnetic radiation source includes a laser or a light emitting diode, and the sensor includes a photodiode.

8. The MEMS optical microphone according to claim 1, wherein the integrated circuit module is arranged on the first shell wall.

* * * * *